US011681385B2

(12) United States Patent
Kara et al.

(10) Patent No.: US 11,681,385 B2
(45) Date of Patent: Jun. 20, 2023

(54) ROTARY ACTUATOR ASSEMBLY

(71) Applicant: KOSTAL Automobil Elektrikk GmbH & Co. KG, Luedenscheid (DE)

(72) Inventors: Cem Kara, Dortmund (DE); Lars Klisch, Menden (DE)

(73) Assignee: KOSTAL Automobil Elektrik GmbH & Co. KG, Luedenscheid (DE)

( * ) Notice: Subject to any disclaimer, the term of this patent is extended or adjusted under 35 U.S.C. 154(b) by 0 days.

(21) Appl. No.: 17/943,623

(22) Filed: Sep. 13, 2022

(65) Prior Publication Data

US 2023/0004237 A1    Jan. 5, 2023

Related U.S. Application Data

(63) Continuation of application No. PCT/EP2021/056553, filed on Mar. 15, 2021.

(30) Foreign Application Priority Data

Mar. 18, 2020 (DE) .................... 10 2020 001 780.0

(51) Int. Cl.
  *G06F 3/0362* (2013.01)
  *G06F 3/039* (2013.01)
  *G06F 3/044* (2006.01)

(52) U.S. Cl.
  CPC .......... *G06F 3/0362* (2013.01); *G06F 3/0393* (2019.05); *G06F 3/044* (2013.01)

(58) Field of Classification Search
  CPC ....... G06F 3/0362; G06F 3/0393; G06F 3/044
  See application file for complete search history.

(56) References Cited

U.S. PATENT DOCUMENTS 7,570,254 B2 *  8/2009  Suzuki ............... B60K 37/06
                                              345/157
2014/0042004 A1   2/2014  Tseng
(Continued)

FOREIGN PATENT DOCUMENTS

CN    110462569 A  * 11/2019  ............. B60K 37/06
DE    102018120576 B3    1/2020
(Continued)

OTHER PUBLICATIONS

Chang-Ju Lee, Jong Kang Park, et al., Mutual Capacitive Sensing Touch Screen Controller for Ultrathin Display with Extended Signal Passband Using Negative Capacitance, Published Oct. 26, 2018.
(Continued)

*Primary Examiner* — Michael Pervan
(74) *Attorney, Agent, or Firm* — Brooks Kushman P.C.

(57) ABSTRACT

A rotary actuator assembly includes a rotary actuator having a rotary body on a capacitively-sensing detection surface of the touch panel. A sensor ring coupled to the rotary body includes on a first ring surface includes alternately arranged contact surfaces and insulating surfaces and on a second ring surface includes a circumferential metal surface that is electrically connected to the contact surfaces. A sliding contact includes a contact pad and a contact spring connected together. The contact pad forms an electrical contact point fixed at a position of the detection surface. The contact spring contacts the contact surfaces and the insulating surfaces in alternation as the sensor ring rotates with rotation of the rotary body whereby a variable electrical signal is generated at the contact point. The electrical signal is detectable by the touch panel and the touch panel includes a mutual capacitance touch sensor assembly.

9 Claims, 9 Drawing Sheets

(56) References Cited

U.S. PATENT DOCUMENTS

2019/0391672 A1  12/2019  Fischer et al.
2020/0064951 A1   2/2020  Bauer et al.

FOREIGN PATENT DOCUMENTS

| DE | 1020181188339 A1 |   | 2/2020 |   |          |
|----|------------------|---|--------|---|----------|
| DE | 102019001842 A1  | * | 9/2020 | … | B60K 37/06 |
| EP | 3938858 B1       | * | 1/2023 | … | B60K 37/06 |
| WO | 2018137944 A1    |   | 8/2018 |   |          |
| WO | 2020011416 A1    |   | 1/2020 |   |          |

OTHER PUBLICATIONS

European Patent Office, International Search Report for International Application No. PCT/EP2021/056553, dated Jun. 10, 2021.
German Patent and Trademark Office, German Search Report for German Patent Application No. 10 2020 301 780.0 dated Dec. 21, 2020.
The International Bureau of WIPO, International Preliminary Report on Patentability for International Application No. PCT/EP2021/056553 dated Sep. 20, 2022.

\* cited by examiner

SR, SK, Mux, AS

FIG. 13C

ROTARY ACTUATOR ASSEMBLY

CROSS-REFERENCE TO RELATED APPLICATIONS

This application is a continuation of International Application No. PCT/EP2021/056553, published in German, with an international filing date of Mar. 15, 2021, which claims priority to DE 10 2020 001 780.0, filed Mar. 18, 2020, the disclosures of which are hereby incorporated in their entirety by reference herein.

TECHNICAL FIELD

The present invention relates to a rotary actuator assembly having a rotary actuator situated on a capacitively-sensing detection surface of a touch panel, the rotary actuator including a stator that forms at least one electrical contact point which rests against a fixed position of the detection surface, the rotary actuator further including a rotary body rotatably supported on the stator and coupled to a sensor ring that is rotatable with respect to the stator, wherein changes in the position of the sensor ring generate variable electrical signals at the electrical contact point, the electrical signals being detectable by the touch panel, and the sensor ring, on a first ring surface along its circumference, includes contact surfaces and insulating surfaces in alternation which may be contacted by at least one contact spring that is fixed to the stator, and the at least one contact spring is electrically connected to a respective electrical contact point.

BACKGROUND

This type of rotary actuator assembly is known from U.S. Publication No. 2014/0042004 A1.

Such rotary actuator assemblies use the capacitively sensing detection surface of a touch panel to determine the rotational position of a rotatable operating or control element. The touch panel may be designed either as a touchpad or as a touchscreen. The touchscreen additionally includes display elements and thus being able to graphically display information concerning the present rotational position of the operating element.

It is necessary to change an electrical capacitance in order to influence a capacitively detecting touch panel. For this purpose, the body capacitance of a human user is typically utilized in known rotary actuator assemblies via an electrically conductive connection. The disadvantage here is that the correct functioning depends on external factors. If the user is wearing thick gloves, for example, then a function is no longer provided due to the lack of a coupling.

Alternatively, it may be provided that the rotary actuator itself has sufficient capacitance to influence the touch panel. However, this requires provision of a metal body with adequate mass at the rotary actuator. Such a design prevents, firstly, development of particularly compact rotary actuators, and secondly, manufacture of the rotary body, provided as the operating element, from a freely selectable material.

SUMMARY

An object is to provide a rotary actuator assembly that does not have the above-mentioned problems.

In embodiments of the present invention, a rotary actuator assembly includes a rotary actuator and a touch panel. The rotary actuator includes a stator, a rotary body, and a sensor ring. The stator is situated on a capacitively-sensing detection surface of the touch panel. The stator forms at least one electrical contact point which abuts a fixed position of the detection surface of the touch panel. At least one contact spring is fixed on the stator and is electrically connected respectively to the at least one electrical contact point. The rotary body is rotatably mounted on the stator. The sensor ring is coupled to the rotary body to be rotatable with the rotary body relative to the stator. The sensor ring includes a first ring surface and a second ring surface. The first ring surface includes contact surfaces and insulating surfaces alternately arranged over the circumference thereof. The second ring surface includes a circumferential metal surface that is electrically connected to the contact surfaces of the first ring surface. The contact surfaces and the insulating surfaces are contacted by the at least one contact spring, which is electrically connected respectively to an electrical contact point, as the sensor ring rotates relative to the stator. Rotational position changes of the sensor ring thereby generate variable electrical signals at the least one electrical contact point. The variable electrical signals are detectable by the touch panel. The touch panel includes a "mutual capacitance touch sensor" assembly.

Embodiments of the present invention achieve the above object and/or other objects in that the touch panel includes a sensor assembly of the mutual capacitance touch sensor type, and in that the second ring surface of the sensor ring includes a circumferential metal surface that is electrically connected to the contact surfaces of the first ring surface.

The proposed rotary actuator assembly achieves the above-stated object in a particularly simple and cost-effective manner.

As explained below based on exemplary embodiments, the rotary actuator assembly functions independently of a coupling to the electrical body capacitance of a human user. This is advantageous for reliable functioning, as the functioning is not so dependent on variable or changing external circumstances. It is particularly advantageous that the rotary actuator assembly may be operated with any kind of gloves or with electrically nonconductive prostheses, and thus functions reliably.

It is likewise particularly advantageous that the self-capacitance of the rotary actuator is of secondary importance. Thus, the rotary actuator does not require a solid metal body, which allows the implementation of particularly compact rotary actuators.

This results in the further advantage that the material of which the rotary body is made may be freely selected. The rotary body may thus be made completely of plastic, for example, or from so-called natural materials such as wood.

It is also advantageous that the rotary body may be designed in the particularly advantageous form of a toroidally or hollow cylindrically shaped rotary ring. Such a rotary ring has an inner recess via which portions of the touch panel are discernible. When the touch panel is designed as a touchscreen, information concerning the present rotational position, such as a percentage of the set magnitude, may be displayed within the rotary ring. In particular, when multiple rotary actuators are used on a touchscreen, this in turn allows a simplified association between the rotary actuators and the display, and better utilization of the surface area of the touchscreen.

It is also particularly advantageous that the rotary actuator only has to rest against (be in contact with) one or just a few contact points at the touch panel, which also makes it possible to arrange the rotary actuator at the edge of the touch panel while taking up only a small portion of the detection surface.

BRIEF DESCRIPTION OF THE DRAWINGS

Operating principles (mode of operations) and possible advantageous embodiments and refinements of a rotary actuator assembly according to the present invention are explained in greater detail below, based on exemplary embodiments illustrated in the drawings. The drawings show the following.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
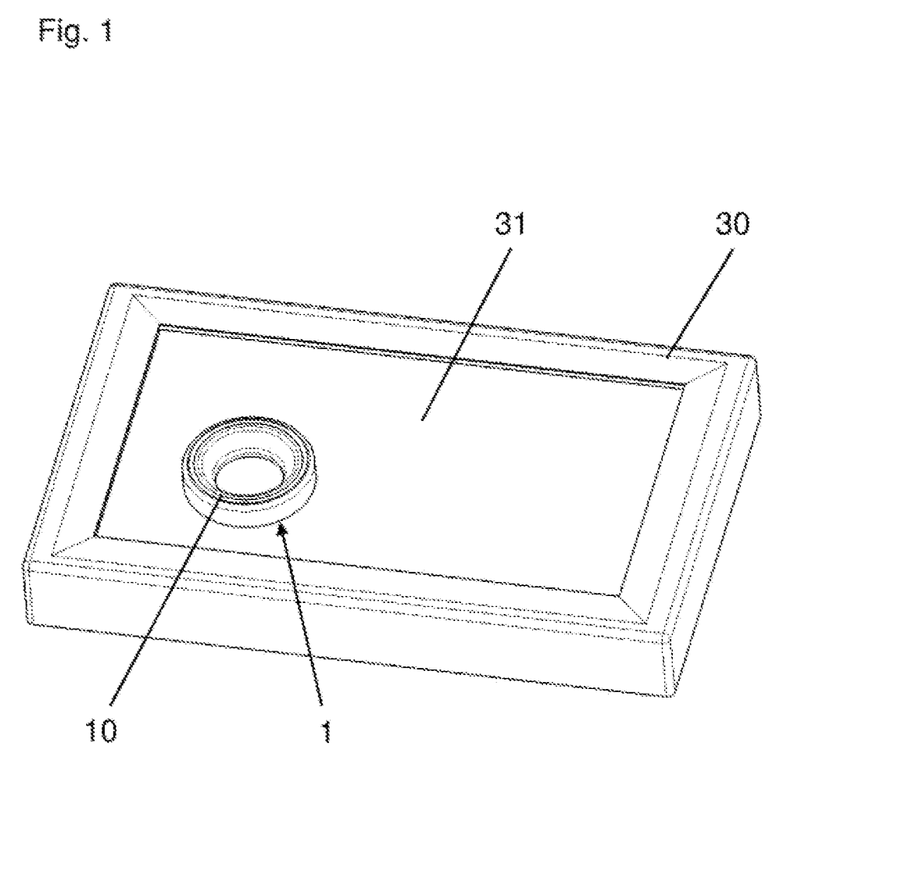
FIG. 1 illustrates a rotary actuator assembly according to an exemplary embodiment.

FIG. 1 schematically shows a rotary actuator assembly that is designed according to an exemplary embodiment. The rotary actuator assembly includes a rotary actuator 1 and a touch panel 30. Rotary actuator 1 is shown in FIG. 1 as being arranged on a capacitively sensing detection surface 31 of touch panel 30.

Touch panel 30 may either be designed without display elements, i.e., as a simple touchpad, or may have a display, thus forming a touchscreen, for example. It is particularly advantageous to provide a touchscreen as touch panel 30 as information depicting an actuation of rotary actuator 1 may be represented on the display of the touchscreen.

In any case, the spatially resolving properties of detection surface 31, as well as the evaluation electronics that are part of touch panel 30, are used to determine the rotational position and optionally the amplitude of rotation (i.e., the rotational range) of rotary actuator 1.

Rotary actuator 1 includes a rotary body 10. Rotary body 10, which represents the operating or control element that is to be adjusted by a user, is the only part of rotary actuator 1 illustrated in FIG. 1. Rotary body 10 preferably has a shape that is rotationally symmetrical with respect to its rotational axis, and may be designed, for example, as a cylindrical rotary knob or, as illustrated in FIG. 1, as a toroidally or hollow cylindrically shaped rotary ring.

The design of rotary body 10 as a toroidally or hollow cylindrically shaped rotary ring is particularly advantageous since it has a central recess. In the case of touch panel 30 designed as a touchscreen, it is also thus possible to represent information within the rotary ring.

Rotary actuator 1 further includes a stator (not shown). Rotary body 10 is situated at (arranged on) the stator. The design of the stator of rotary actuator 1 and possible rotatable arrangements of rotary body 10 at the stator are known from U.S. Publication No. 2014/0042004 A1, for example. Therefore, a graphical representation of the stator is dispensed with here.

Figure 2:
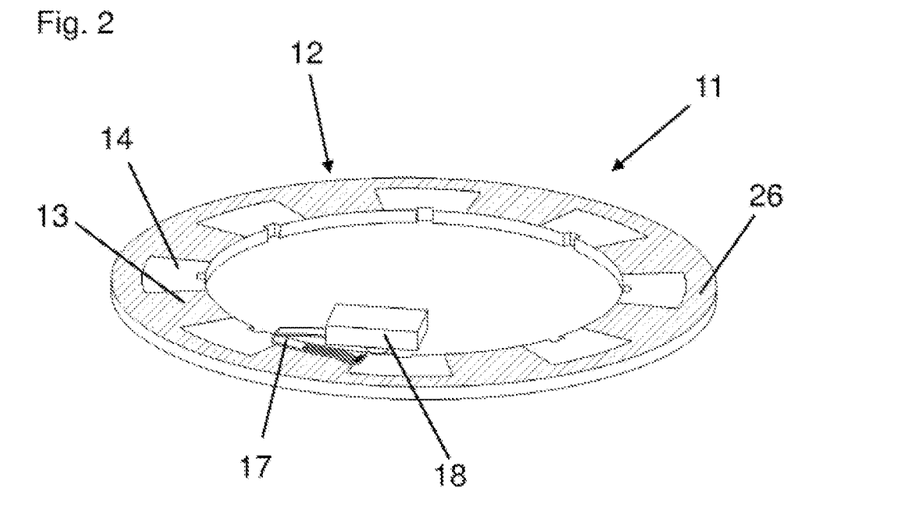
FIG. 2 illustrates a first ring surface of a sensor ring of the rotary actuator assembly.
Figure 3:
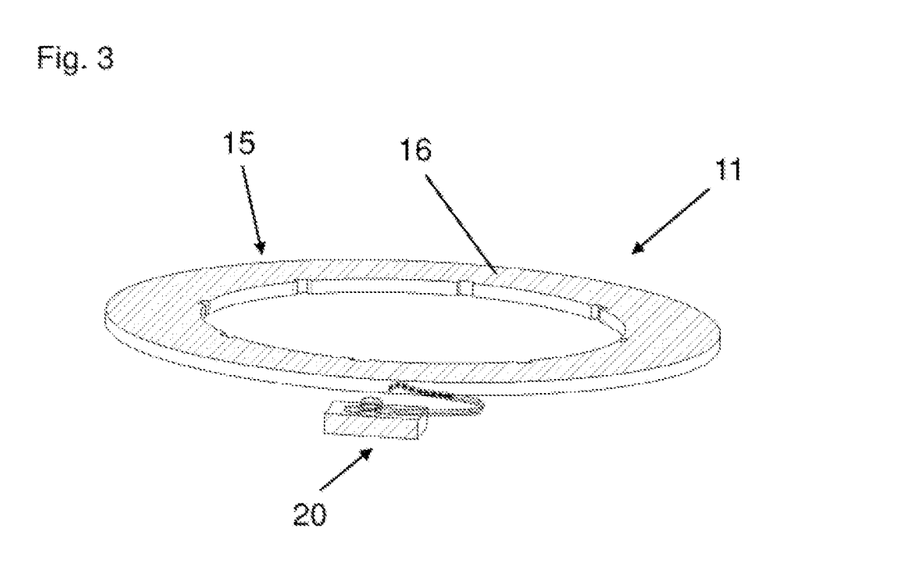
FIG. 3 illustrates a second ring surface of the sensor ring.
Figure 6:
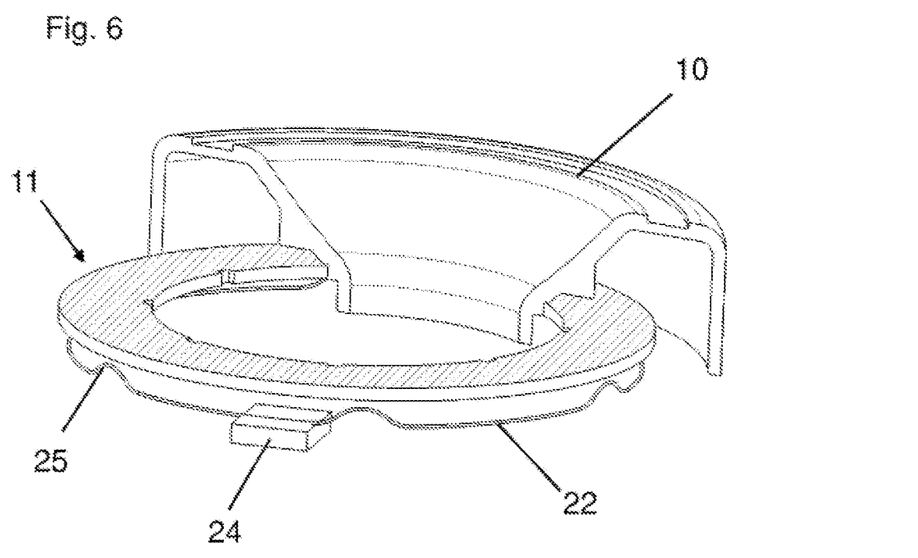
FIG. 6 illustrates a first view of the sensor ring on a rotary body of the rotary actuator assembly.
Figure 7:
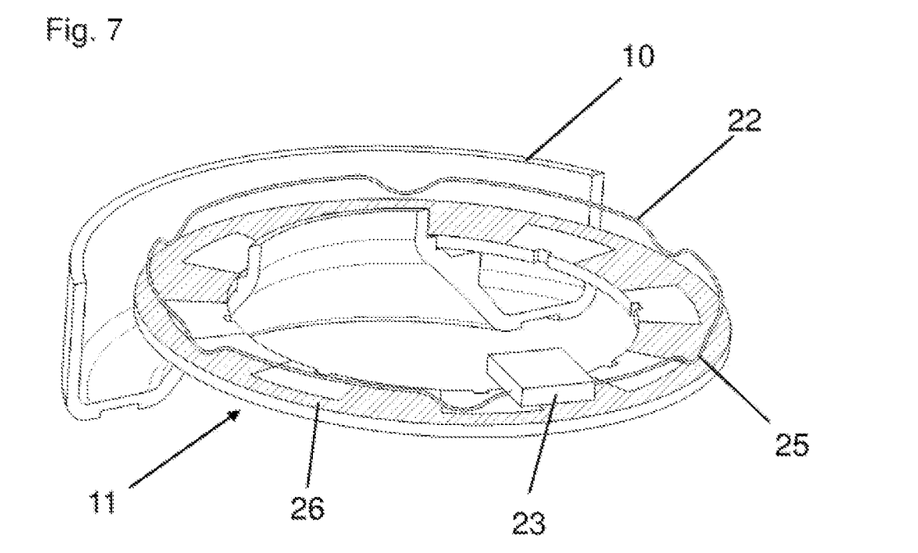
FIG. 7 illustrates an opposite second view of the sensor ring on the rotary body.

Rotary actuator 1 further includes a sensor ring 11, shown in FIGS. 2 and 3. As shown in FIGS. 6 and 7, sensor ring 11 is situated within rotary body 10.

Sensor ring 11 includes a first ring surface 12, shown in FIG. 2, and a second ring surface 15, shown in FIG. 3. Sensor ring 11 is made up of a circular ring-shaped (annular), double-sided printed circuit board that includes circumferential electrically conductive segments and electrically insulating segments, as contact surfaces 13 and insulating surfaces 14, in alternation on first ring surface 12. On second ring surface 15 parallel thereto, a metal surface 16, preferably designed as a copper layer, is circumferentially situated thereon.

Contact surfaces 13 are all electrically connected to one another. As illustrated in FIG. 2, these connections may be established by a circumferential electrically conductive contact ring 26 at the edge of first ring surface 12. In any case, contact surfaces 13 are also connected to metal surface 16 on second ring surface 15, preferably via one or more feedthroughs or plated-through holes in sensor ring 11.

In an alternative design, the sensor ring may be formed as a metal ring that is covered by multiple insulating segments along its circumference.

Figure 9:
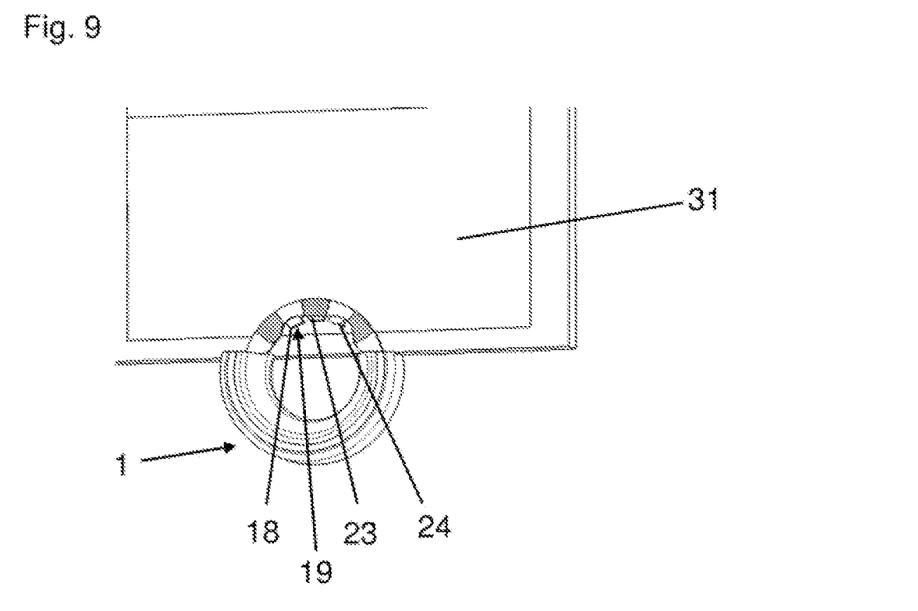
FIG. 9 illustrates the advantageous arrangement of the rotary actuator on the touchpad in a partial sectional view.

Rotary actuator 1 further includes a sliding contact 20. Sliding contact 20 is mechanically connected to the stator. Sliding contact 20 includes a contact spring 17 and a contact pad 18. Contact pad 18 rests against detection surface 31 of touch panel 30 (FIG. 1) and forms an electrical contact point 19 there as indicated in FIG. 9. Contact spring 17 is mechanically and electrically connected to contact pad 18. Contact spring 17 rests against or on first ring surface 12 of sensor ring 11. Contact spring 17 together with contact pad 18 form sliding contact 20, which rests against contact surfaces 13 and insulating surfaces 14 in alternation when sensor ring 11 rotates.

Figure 4:
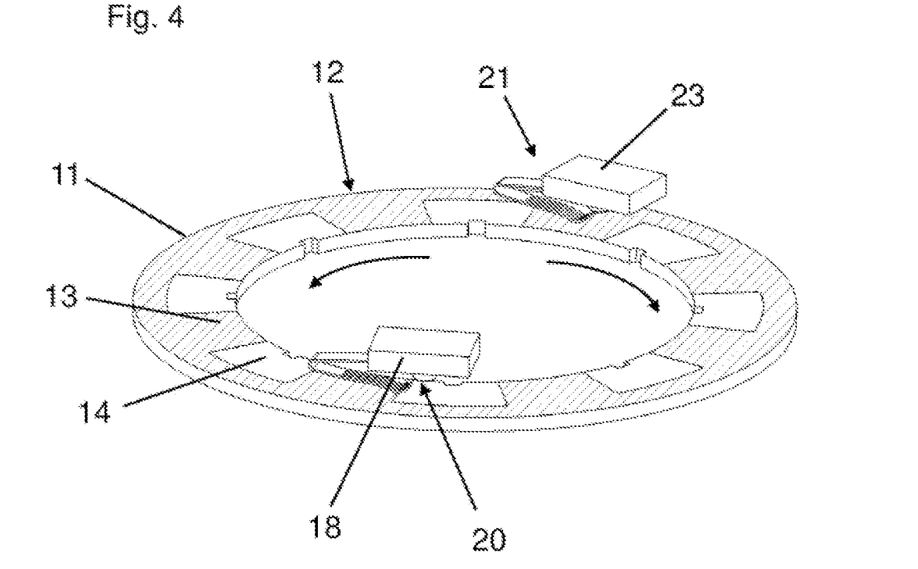
FIG. 4 illustrates the sensor ring with a sliding contact assembly.

In an embodiment illustrated in FIG. 4, rotary actuator 1 includes two sliding contacts 20 and 21, whose contact springs scan contact surfaces 13 and insulating surfaces 14 of first ring surface 12 of sensor ring 11.

Figure 5:
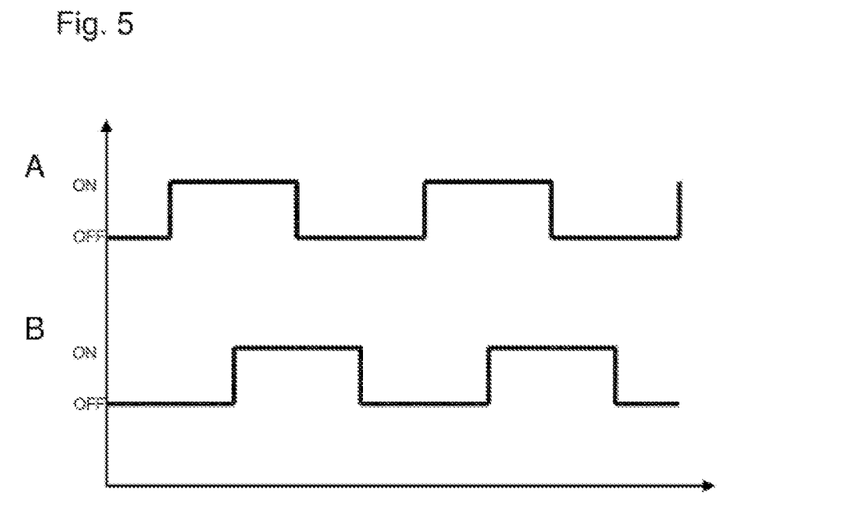
FIG. 5 illustrates a pulse diagram.

As indicated in FIG. 5, the contact springs of sliding contacts 20 and 21 are positioned relative to contact surfaces 13 and insulating surfaces 14 of first ring surface 12 of sensor ring 11 in such a way that electrical signals A and B detected by sliding contacts 20 and 21 have a phase shift relative to one another. Based on the sequence of the detected signal states, an evaluation electronics system of touch panel 30 may determine the rotational direction of rotary body 10.

A further advantageous embodiment of rotary actuator 1 is illustrated in FIGS. 6 and 7. FIGS. 6 and 7 show two perspectives of sensor ring 11 situated at rotary body 10, and of a wire ring 22 that is connected to the stator of rotary actuator 1. Wire ring 22 has multiple protrusions or bulges 25 extending in the direction of sensor ring 11. Wire ring 22 is made up of a stable wire that is as thin as possible and that has only a low self-capacitance.

The diameter of wire ring 22 corresponds to the diameter of contact ring 26 on sensor ring 11. Another contact pad 24 that rests against detection surface 31 of touch panel 30 is connected to wire ring 22.

Contact ring 26 of first ring surface 12 of sensor ring 11 comes into contact with at least one of protrusions 25 of wire ring 22 from rotary body 10 shifting or tilting relative to the stator. This results in an electrical connection between conductive surfaces 13, 16, and 26 of sensor ring 11 and contact pad 24, which may be detected by touch panel 30. An additional pushbutton function is thus achieved in a simple manner.

Figure 8:
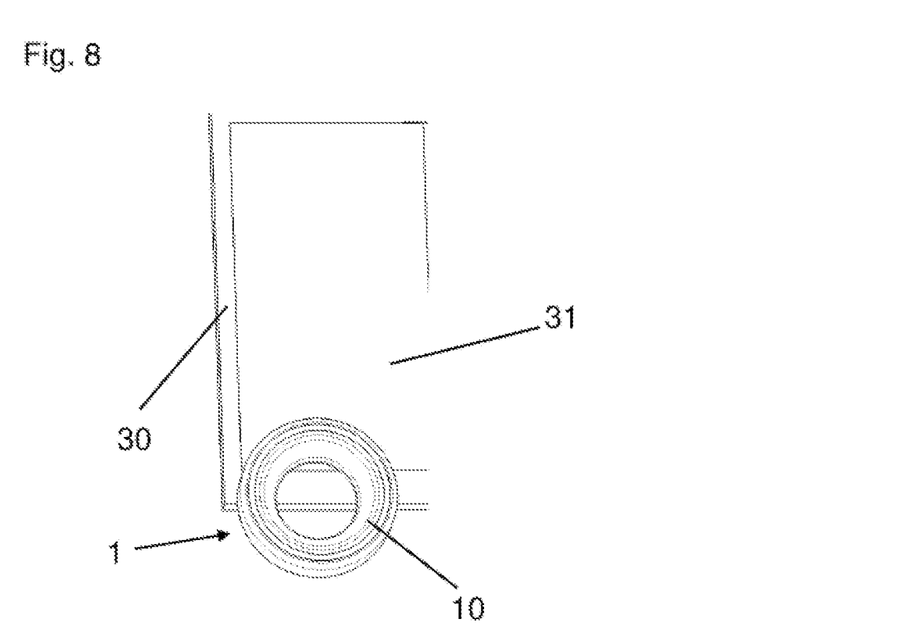
FIG. 8 illustrates an advantageous arrangement of the rotary actuator on a touchpad.

FIGS. 8 and 9 show that for forming the rotary actuator assembly, rotary body 10 may be situated far out at the edge of touch panel 30, so that only a small overlap of rotary actuator 1 with detection surface 31 of touch panel 30 results. This allows better use to be made of detection surface 31, or alternatively, allows a relatively small touch panel 30 to be provided or also a larger number of rotary actuators 1 to be situated on touch panel 30.

As illustrated in the sectional view of FIG. 9, this is achieved in that no movable slider moves on detection surface 31, and that only relatively few contact pads 18, 23, and 24, which may also be relatively close to one another, need to be situated on detection surface 31. Thus, with only the three illustrated contact pads 18, 23, and 24 of rotary actuator 1, a rotary actuator assembly may be implemented that has detection of the amplitude of rotation and of the rotational direction, as well as a pushbutton function.

For capacitively sensing touch panels, primarily two functional principles, known as the self-capacitance touch sensor principle and the mutual capacitance touch sensor principle, are known.

The self-capacitance touch sensor principle, not used here, employs an x-y grid of open conducting electrodes that are connected to a controller. These conducting electrodes, the same as a capacitor plate, have a certain capacitance relative to earth ground which may be detected by a sensor system. When an electrode is touched or approached, the detected capacitance at the electrode changes due to the additional capacitance of the human body that acts.

To implement rotary actuator 1 according to the present invention, touch panel 30 is presumed to be a touchpad of the mutual capacitance touch sensor type which uses the mutual capacitance principle for touch recognition. This principle is schematically illustrated in FIGS. 10A, 10B, and 10C, which illustrate the functional principle of a mutual capacitance touch panel, and FIGS. 11A, 11B, and 11C, which illustrate the operating principle of the mutual capacitance touch panel when touched.

A touchpad that operates according to this functional principle includes a two-dimensional matrix made up of transmission elements Tx and reception elements Rx situated in alternation. For explaining the function, only a short one-dimensional section from this matrix is illustrated.

The reception elements Rx (illustrated with no shading) are all jointly connected to an evaluation circuit AS. The transmission elements Tx (illustrated with dark shading) are connected to a multiplexer Mux that acts on all transmission elements Tx with a transmission signal, row by row and column by column in succession. For this purpose, via the multiplexer switch MS schematically illustrated here as a changeover switch, only one transmission element Tx is ever connected to a transmission signal line SL, while at the same time, all other transmission elements Tx are connected to device ground GND.

Figure 10A:
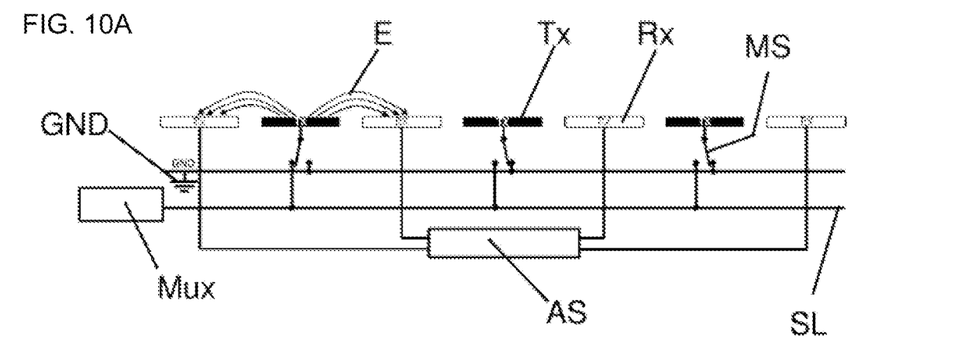
FIGS. 10A, 10B, and 10C illustrate the functional principle of a mutual capacitance touch panel.
Figure 10B:
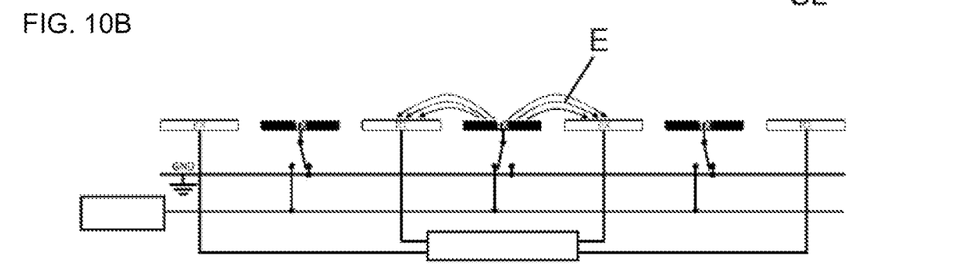
Figure 10C:
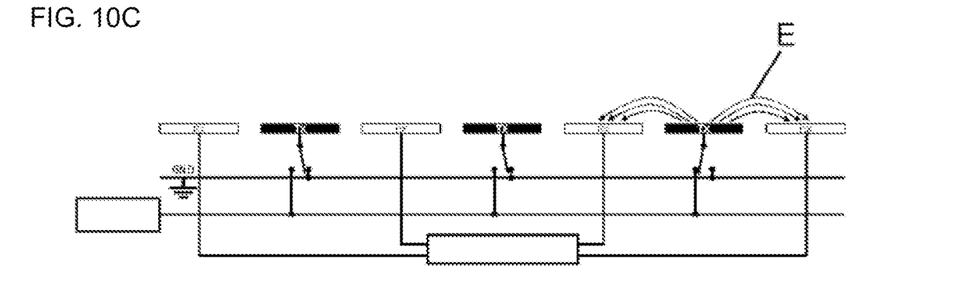
Figure 11A:
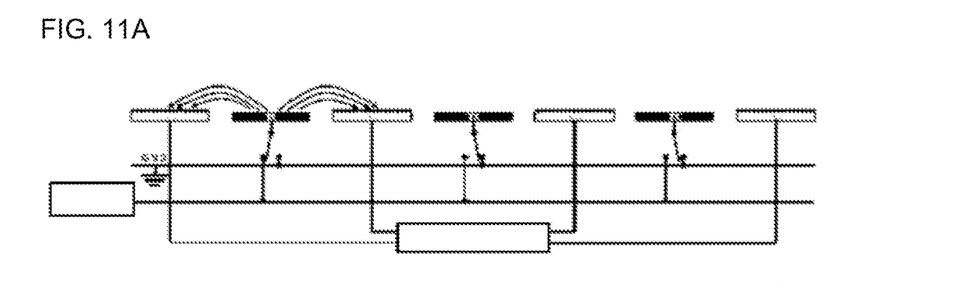
FIGS. 11A, 11B, and 11C illustrate the operating principle of the mutual capacitance touch panel when touched.

As is apparent from FIGS. 10A, 10B, and 10C, an electrical field E thus migrates from one transmission element Tx to the next and is detected in each case by the reception elements Rx adjacent to the respective transmission element Tx. As long as no contact event takes place, the overall signal strengths detected by reception elements Rx and recorded by evaluation circuit AS are always approximately equal at any point in time.

Figure 11B:
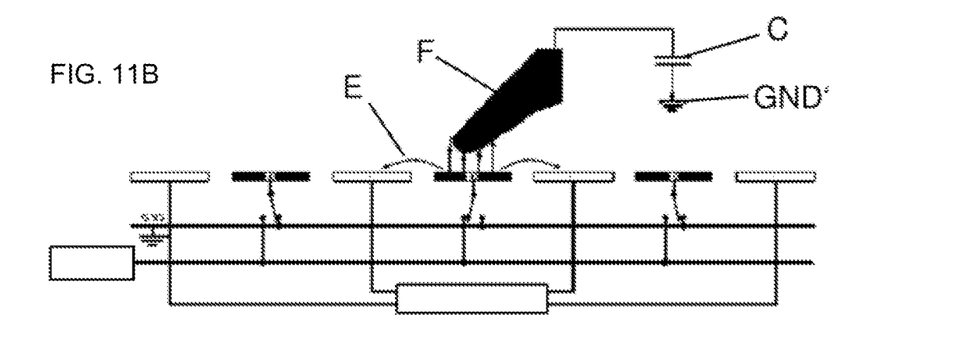
Figure 11C:
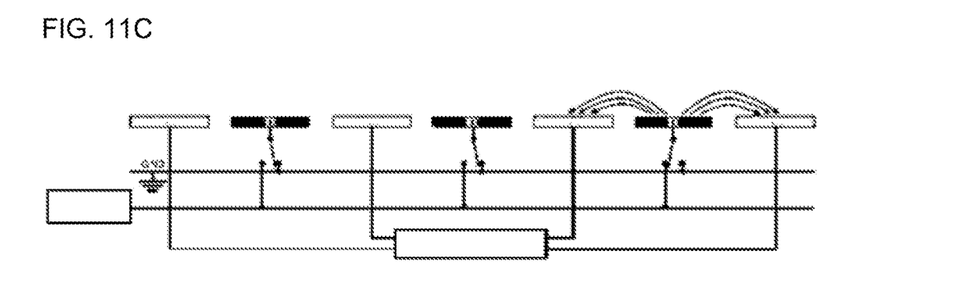

This changes when, as indicated in FIG. 11B, a human finger F is brought into the vicinity of one of the transmission elements Tx.

When the touched transmission element Tx is actively switched by multiplexer Mux, the finger F capacitively couples to the electrical field E emanating from the transmission element Tx. Due to the relatively high capacitance C of the human body, via the human body there is a further capacitive coupling to ground GND', which greatly weakens the electrical field E. At this point in time the evaluation circuit AS records a reduced intensity of the electrical field E at the reception elements Rx. Since multiplexer Mux and evaluation circuit AS are both part of the same touch panel electronics system, evaluation circuit AS may easily determine the coordinates of transmission element Tx that is active at this point in time.

According to this functional principle, it is also possible to recognize contacts at multiple locations within a multiplex cycle, not exactly simultaneously, but very quickly in succession at millisecond intervals, and thus "quasi-simultaneously."

For the rotary actuator assembly according to the present invention, a sensor ring SR according to the above description is used instead of a human finger F. Compared to the human body, the sensor ring SR has only a very low electrical capacitance. Therefore, it initially appears surprising that the sensor ring SR generates an evaluatable or analyzable signal on a capacitive touch panel.

Figure 12A:
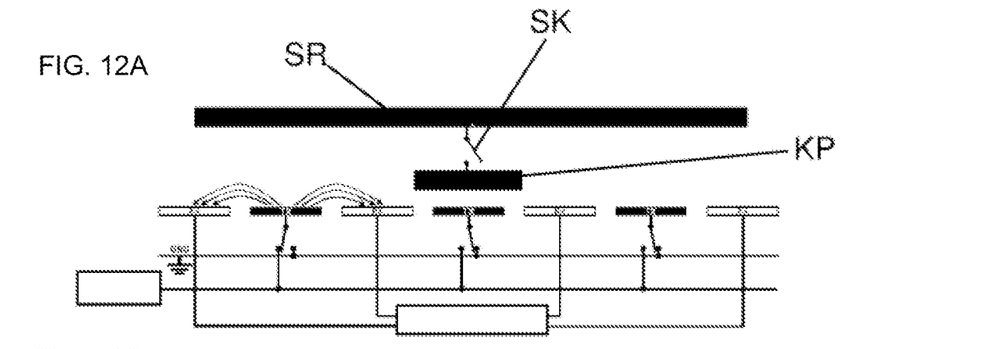
FIGS. 12A, 12B, and 12C illustrate the operating principle of the rotary actuator assembly when a switch implemented by a sliding contact of the sliding contact assembly is opened.
Figure 12B:
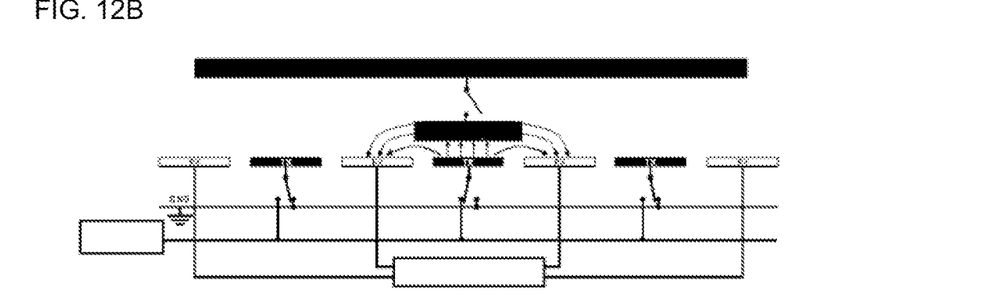
Figure 12C:
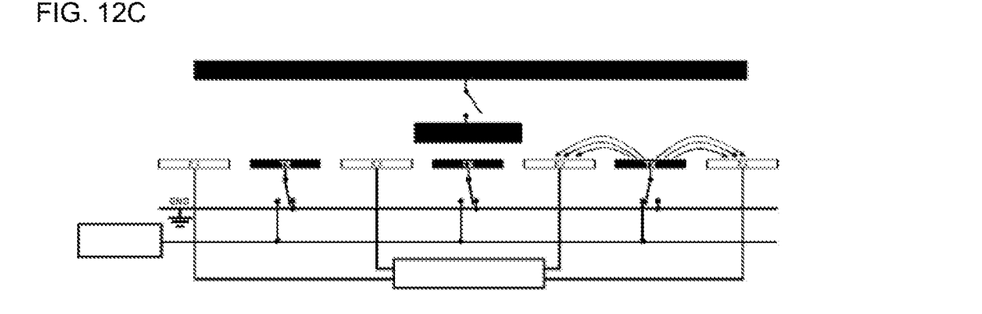
Figure 13A:
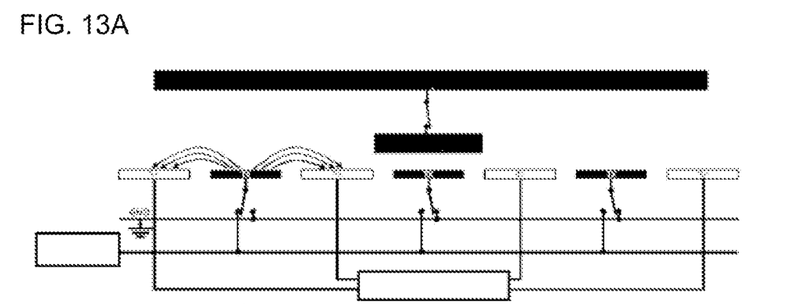
FIGS. 13A, 13B, and 13C illustrate the operating principle of the rotary actuator assembly when the switch implemented by the sliding contact of the sliding contact assembly is closed.
Figure 13B:
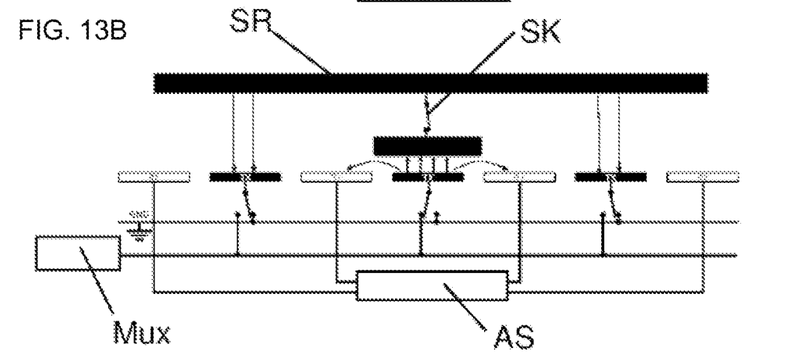
Figure 13C:
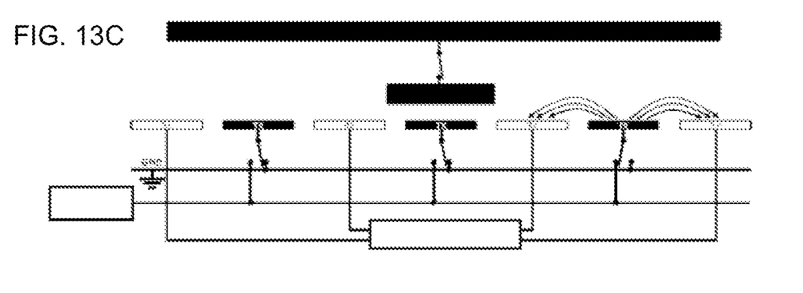

The electrical operating principle of the rotary actuator according to the present invention is depicted in FIGS. 12A, 12B, and 12C and FIGS. 13A, 13B, and 13C by a sensor ring SR shown schematically and a sliding contact SK shown by a switch symbol. The touching or contact of an electrically conductive contact surface 13 by contact spring 17 of sliding contact 20 (FIGS. 2 and 4), shown in FIGS. 13A, 13B, and 13C, is represented by sliding contact SK being a closed switch, and the contact of an insulating surface 14 by contact spring 17 of sliding contact 20, shown in FIGS. 12A, 12B, and 12C, is correspondingly represented by sliding contact SK being an opened switch. Sliding contact SK thus connects or disconnects the mutually electrically connected conductive surfaces of sensor ring SR by use of a contact pad KP that is capacitively coupled to a transmission element Tx situated underneath.

If this transmission element Tx is actively switched by multiplexer Mux and sliding contact SK is opened, then the electrical field strength E recorded by reception elements Rx (FIG. 12B) does not differ from the field strengths that are detected for the other active transmission elements (FIGS. 12A and 12C), since the self-capacitance of a contact pad KP is relatively low.

This changes as soon as sliding contact SK is closed. As shown in FIG. 13B, the closed sliding contact SK establishes a galvanic connection between contact pad KP and sensor ring SR. This results, on the one hand, in a capacitive coupling between the active transmission element Tx and contact pad KP, and on the other hand, in a further capacitive coupling due to a sufficient proximity of the conductive surfaces of sensor ring SR to the surrounding inactive transmission elements Tx.

Since all inactive transmission elements are connected to device ground GND by the multiplexer, via their capacitive connection, charges may be shifted, which reduces the field strength that is recorded by reception elements Rx around the active transmission element Tx. Evaluation circuit AS may thus distinguish between a closed sliding contact SK and an opened sliding contact SK.

Similarly, multiple sliding contacts 20 and 21 of rotary actuator 1 may of course also be evaluated in a corresponding manner, or a pressure actuation on rotary body 10 may also be recognized for a push switch function, in this case the contact of contact ring 26 with wire ring 22 (FIGS. 6 and 7) taking over the role of a closed sliding contact SK.

LIST OF REFERENCE SYMBOLS 1 rotary actuator
10 rotary body (rotary ring)
11 sensor ring
12 first ring surface of the sensor ring
13 contact surface(s) of the first ring surface
14 insulating surfaces of the first ring surface
15 second ring surface of the sensor ring
16 metal surface of the second ring surface
17 contact spring of the first sliding contact
18 contact pad of the first sliding contact
19 contact point
20 first sliding contact
21 second sliding contact
22 wire ring
23 contact pad
24 contact pad
25 protrusions
26 contact ring
30 touch panel
31 detection surface of the touch panel
A, B electrical signals
AS evaluation circuit
C capacitance (of a human)
E electrical field
F finger
GND (device) ground
GND' (earth) ground
KP contact pad
MS multiplexer switch
Rx reception elements
SK sliding contact
SL transmission signal line
SR sensor ring
Mux multiplexer
Tx transmission elements While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A rotary actuator assembly comprising:
a touch panel having a capacitively-sensing detection surface;
a rotary actuator including a stator, a rotary body, a sensor ring, and a sliding contact, the stator being situated on the detection surface of the touch panel, the rotary body being rotatably mounted on the stator, the sensor ring being coupled to the rotary body to be rotatable with the rotary body relative to the stator, the sensor ring including a first ring surface and a second ring surface, the first ring surface having contact surfaces and insulating surfaces alternately arranged over the circumference thereof and the second ring surface having a circumferential metal surface that is electrically connected to the contact surfaces of the first ring surface, the sliding contact being connected to the stator and having a contact pad and a contact spring connected together, the contact pad resting against a position of the detection surface of the touch panel and forming an electrical contact point fixed at the position, and the contact spring resting against the first ring surface of the sensor ring and contacting the contact surfaces and the insulating surfaces of the first ring surface in alternation as the sensor ring rotates relative to the stator with rotation of the rotary body whereby a variable electrical signal is generated at the electrical contact point; and
wherein the variable electrical signal is detectable by the touch panel and the touch panel includes a mutual capacitance touch sensor assembly.

2. The rotary actuator assembly of claim 1 wherein:
the rotary body includes an electrically nonconductive material.

3. The rotary actuator assembly of claim 1 wherein:
the rotary body is a rotary knob or as a toroidally or hollow cylindrically shaped rotary ring.

4. The rotary actuator assembly of claim 1 wherein:
the rotary actuator further includes a second sliding contact, the second sliding contact being connected to the stator and having a second contact pad and a second contact spring connected together, the second contact pad resting against a second position of the detection surface of the touch panel and forming a second electrical contact point fixed at the second position, the second contact spring resting against the first ring surface of the sensor ring, and the second contact spring contacting the contact surfaces and the insulating surfaces of the first ring surface in alternation as the sensor ring rotates relative to the stator with rotation of the rotary body whereby a second variable electrical signal is generated at the second electrical contact point; and
wherein the second variable electrical signal is detectable by the touch panel.

5. The rotary actuator assembly of claim 1 wherein:
the sensor ring is formed by a circular ring-shaped, double-sided circuit board.

6. The rotary actuator assembly of claim 1 wherein:
the rotary body is shiftably situated relative to the stator;
the first ring surface of the sensor ring further including a contact ring that is connected to the contact surfaces; and the rotary actuator further including a wire ring that is connected to another electrical contact point at another fixed position of the detection surface of the touch panel, the wire ring contacting the contact ring when the rotary body is shifted relative to the stator.

7. A rotary actuator assembly comprising:

a touch panel having a capacitively-sensing detection surface;

a rotary actuator including a rotary body and a sensor ring, the rotary body being situated on the detection surface of the touch panel, the sensor ring being coupled to the rotary body to be rotatable therewith, the sensor ring including a first ring surface and a second ring surface, the first ring surface having contact surfaces and insulating surfaces alternately arranged over the circumference thereof and the second ring surface having a circumferential metal surface that is electrically connected to the contact surfaces of the first ring surface;

a sliding contact having a contact pad and a contact spring connected together, the contact pad resting against a position of the detection surface of the touch panel and forming an electrical contact point fixed at the position, and the contact spring resting against the first ring surface of the sensor ring and contacting the contact surfaces and the insulating surfaces of the first ring surface in alternation as the sensor ring rotates with rotation of the rotary body whereby a variable electrical signal is generated at the electrical contact point; and wherein the variable electrical signal is detectable by the touch panel and the touch panel includes a mutual capacitance touch sensor assembly.

8. The rotary actuator assembly of claim 7 wherein:

the rotary actuator further includes a second sliding contact, the second sliding contact having a second contact pad and a second contact spring connected together, the second contact pad resting against a second position of the detection surface of the touch panel and forming a second electrical contact point fixed at the second position, and the second contact spring resting against the first ring surface of the sensor ring and contacting the contact surfaces and the insulating surfaces of the first ring surface in alternation as the sensor ring rotates with rotation of the rotary body whereby a second variable electrical signal is generated at the second electrical contact point; and wherein the second variable electrical signal is detectable by the touch panel.

9. The rotary actuator assembly of claim 7 wherein:

the rotary body is shiftably situated relative to the touch panel;

the first ring surface of the sensor ring further including a contact ring that is connected to the contact surfaces; and the rotary actuator further including a wire ring that is connected to another electrical contact point fixed at another position of the detection surface of the touch panel, the wire ring contacting the contact ring when the rotary body is shifted relative to the touch panel.

\* \* \* \* \*